United States Patent
Ooishi et al.

(10) Patent No.: US 8,154,300 B2
(45) Date of Patent: Apr. 10, 2012

(54) VOLTAGE MEASURING DEVICE AND VOLTAGE MEASURING SYSTEM

(75) Inventors: Manabu Ooishi, Shizuoka (JP); Satoshi Ishikawa, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 810 days.

(21) Appl. No.: 12/071,881

(22) Filed: Feb. 27, 2008

(65) Prior Publication Data

US 2008/0203976 A1 Aug. 28, 2008

(30) Foreign Application Priority Data

Feb. 28, 2007 (JP) .................................. 2007-050150

(51) Int. Cl.
*H01M 8/04* (2006.01)
(52) U.S. Cl. .................... 324/434; 320/162; 324/429
(58) Field of Classification Search .......... 324/426–436; 320/162
See application file for complete search history.

(56) References Cited

U.S. PATENT DOCUMENTS

| | | | |
|---|---|---|---|
| 6,281,662 B1 * | 8/2001 | Flohr | 320/141 |
| 6,362,626 B2 * | 3/2002 | Furukawa | 324/429 |
| 2005/0077874 A1 * | 4/2005 | Nakao | 320/116 |

FOREIGN PATENT DOCUMENTS

| | | | |
|---|---|---|---|
| JP | 06205542 A | * | 7/1994 |
| JP | 10-215524 A | | 8/1998 |
| JP | 2003-070179 A | | 3/2003 |
| JP | 2005-318751 | | 11/2005 |

OTHER PUBLICATIONS

Office Action for Japanese Patent Application No. 2007-050150 dated Jul. 5, 2011.

* cited by examiner

*Primary Examiner* — Samuel Berhanu
(74) *Attorney, Agent, or Firm* — Edwards Wildman Palmer LLP

(57) ABSTRACT

In a voltage measuring device, according to a setting of input terminals for setting the number of unit cells to be measured SEL1, SEL2, SEL3, a logic circuit turns on switches in a switching circuit connected to the unit cells to measure a voltage across each unit cell.

7 Claims, 5 Drawing Sheets

FIG. 2

| NUMBER OF CELLS | SEL1 | SEL2 | SEL3 | TERMINALS TO BE USED |
|---|---|---|---|---|
| 8 | GND | GND | GND | IN0~8 |
| 9 | GND | GND | OPEN | IN0~9 |
| 10 | GND | OPEN | GND | IN0~10 |
| 11 | GND | OPEN | OPEN | IN0~11 |
| 12 | OPEN | GND | GND | IN0~12 |
| 12 | OPEN | GND | OPEN | IN0~12 |
| 12 | OPEN | OPEN | GND | IN0~12 |
| 12 | OPEN | OPEN | OPEN | IN0~12 |

FIG. 3

| BLOCK ADDRESS | ADSEL1 | ADSEL2 | ADSEL3 |
|---|---|---|---|
| 1 | GND | GND | GND |
| 2 | GND | GND | OPEN |
| 3 | GND | OPEN | GND |
| 4 | GND | OPEN | OPEN |
| 5 | OPEN | GND | GND |
| 6 | OPEN | GND | OPEN |
| 7 | OPEN | OPEN | GND |
| 8 | OPEN | OPEN | OPEN |

VOLTAGE MEASURING DEVICE AND VOLTAGE MEASURING SYSTEM

CROSS REFERENCE TO RELATED APPLICATIONS

This application is on the basis of Japanese Patent Application No. 2007-050150, the contents of which are hereby incorporated by reference.

BACKGROUND OF THE INVENTION

1. Field of the Invention

The present invention relates to a voltage measuring device, in particular, for measuring a voltage of a high voltage battery mounted on a vehicle composed of a plurality of unit cells connected to each other in series.

2. Description of the Related Art

These days, a hybrid electric vehicle (hereunder referred to as "HEV") using an electric motor together with an engine becomes widely used. This HEV includes a low voltage battery such as 12 V for starting the engine, and a high voltage battery for driving the electric motor. The high voltage battery obtains a high voltage by a plurality of unit cells connected in series. The unit cell is composed of one or more secondary batteries such as a nickel hydride battery or a lithium battery.

In the high voltage battery used for the HEV, it is necessary to measure a voltage of each unit cell for checking a charging condition of each unit cell. These days, in accordance with the performance increase of the HEV, the number of the cells of the high voltage battery is increased, and checking switches for measuring the voltage are increased. In view of this increase, by an integration of the voltage measuring device including the checking switches into an IC (integrated circuit), the number of parts of the voltage measuring device is decreased.

In the case of the integration of the voltage measuring device, Patent Document 1 discloses a method for measuring a voltage of each unit cell in each block consisting of a plurality of unit cells by mounting an IC in each block, and the IC including a switching circuit.

[Patent document 1] Japanese Published Patent Application No. 2005-318751

However, in the above-described case that the IC is mounted on each block, the number of unit cells in the high voltage battery should be a multiple number of checking points of the unit cells per one IC. However, owing to a battery capacity or a performance requirement of a vehicle, the number of the unit cells in the high voltage battery may disagree with the multiple number of the checking points of the unit cells per one IC. For example, if the number of the unit cells of the high voltage battery is fifty, and the checking points of the unit cells per one IC is four, two unit cells will remain. In this case, some measures are needed, for example, increasing the number of the unit cells of the high voltage battery to be a multiple of 4, or preparing another IC having two checking points, or a discrete voltage measuring device for two unit cells.

If the number of unit cells is increased, the voltage of the high voltage battery may not be the most suitable for a vehicle. Further, using another IC or using a discrete voltage measuring device causes an increase of the number of the parts or an increase of a mounting area. Thus, in both cases, a cost of the voltage measuring device increases.

Accordingly, an object of the present invention is to provide a voltage measuring device and a voltage measuring system to allow a suitable design corresponding to the most suitable number of the unit cells of the high voltage battery mounted on a vehicle with no increase in cost.

SUMMARY OF THE INVENTION

In order to attain the object, according to the present invention, there is provided a voltage measuring device including:

a voltage measuring member for measuring a voltage across each unit cell in a block having at least one unit cell of an on vehicle high voltage battery in which the unit cells are connected to each other in series; and a connecting member mounted on each unit cell to connect each unit cell to the voltage measuring member, wherein the connecting member includes: a setting member to set the number of the unit cells to be connected to the voltage measuring member; and a controlling member to connect the connecting member to the voltage measuring member based on the number of the unit cells set by the setting member.

Preferably, the voltage measuring device further includes a battery generating member to generate and supply a specific voltage from an inputted voltage, wherein the unit cell having a top voltage among the unit cells in the block is inputted into the battery generating member, and the battery generating member generates and outputs the specific voltage from the top voltage.

Preferably, the voltage measuring device further includes a voltage switching member for inputting the top voltage into the battery generating member based on the number of the unit cells set by the setting member.

Preferably, the voltage measuring device further includes an address setting member to set a unique address to each block.

Preferably, the voltage measuring device is mounted on each block of the on vehicle high voltage battery which is divided to at least two blocks each having at least one unit cell.

These and other objects, features, and advantages of the present invention will become more apparent upon reading of the following detailed description along with the accompanied drawings.

BRIEF DESCRIPTION OF THE DRAWINGS

FIG. 2 is a table showing a relationship between the number of cells to be measured by the voltage measuring device shown in FIG. 1 and terminal settings;

FIG. 3 is a table showing a relationship between block addresses and terminal settings;

DETAILED DESCRIPTION OF THE PREFERRED EMBODIMENTS

First Embodiment

A first embodiment of the present invention will be explained with figures.

Figure 1:
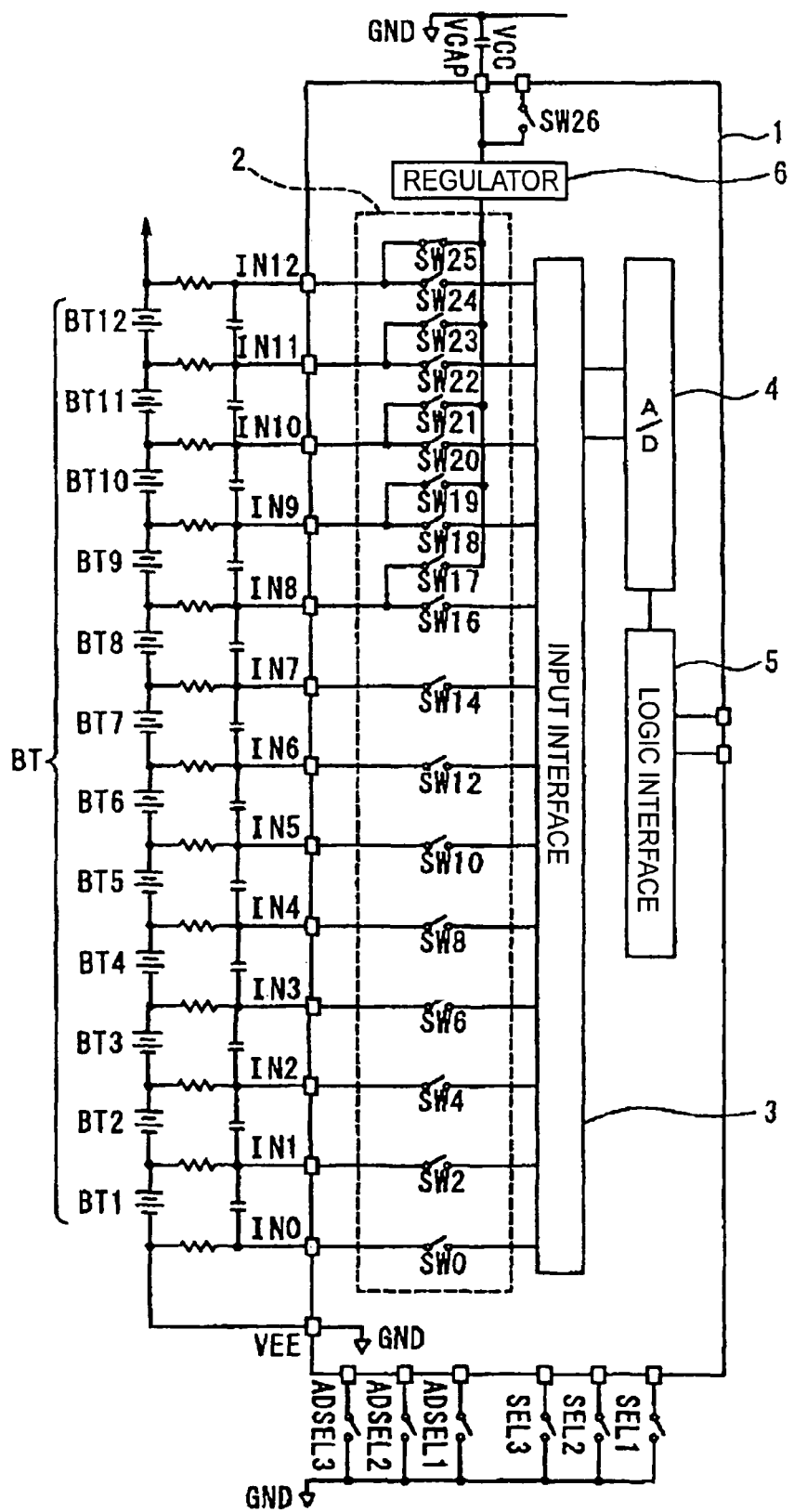
FIG. 1 is a circuit diagram showing a voltage measuring device according to a first embodiment of the present invention.

As shown in FIG. 1, a high voltage battery BT is connected to a voltage measuring device 1. The high voltage battery BT is used for a battery of a not-shown electric motor of the HEV. The electric motor is connected to both ends of the high voltage battery BT when needed, and an alternator as a battery charger is connected to the both ends of the high voltage battery BT when needed.

In the high voltage battery BT a plurality of unit cells are connected in series. In this embodiment, up to twelve unit cells BT1 to BT12 can be connected to input terminals IN0 to IN12 in the voltage measuring device 1. Namely, as shown in FIG. 1, a negative terminal of the unit cell BT1 is connected to the input terminal IN0, and a positive terminal of the unit cell BT1 is connected to the input terminal IN1. A negative terminal of the unit cell BT2 is connected to the input terminal IN1, and a positive terminal of the unit cell BT2 is connected to the input terminal IN2. Similarly, the unit cells BT3 to BT12 are connected to the input terminals IN2 to IN12.

The voltage measuring device 1 according to the first embodiment of the present invention is integrated to one chip (IC), including a switching circuit 2, an input interface 3, an A/D converter 4, a logic circuit 5, and a regulator 6.

The switching circuit 2 as a connecting member and a voltage switching member includes switches SW0, SW2, SW4, SW6, SW8, SW10, SW12, SW14, SW16, SW17, SW18, SW19, SW20, SW21, SW22, SW23, SW24, and SW25. These switches connect both ends of any one of the unit cells BT1 to BT12 to the input interface 3 due to a control of the logic circuit 5. The switches SW17, SW19, SW21, SW23, and SW25 connect the unit cell of a top voltage to the regulator 6 according to the setting of the input terminals for setting the number of the unit cells to be measured SEL1, SEL2, and SEL3.

As shown in FIG. 2, the input terminals for setting the number of the unit cells to be measured SEL1, SEL2, and SEL3 as a setting member set the number of the unit cells to be measured by grounding or opening the terminals thereof. In this embodiment, the number of the unit cells to be measured is variable from 8 to 12.

The input interface 3 as a voltage measuring member measures a voltage across the unit cell connected by the switching circuit 2. The measured voltage is outputted to the A/D converter 4.

The A/D converter 4 converts the analog voltage value inputted from the input interface 3 into a digital value, and outputs the digital value to the logic circuit 5.

The logic circuit 5 as a controlling member outputs the voltage value inputted from the A/D converter 4 to a not-shown CPU. The logic circuit 5 compares a block address designated by the not-shown CPU with an address set by input terminals for setting the block address ADSEL1, ADSEL2, and ADSEL3. When both addresses are the same, the logic circuit 5 instructs the input interface 3 to measure the voltage.

As shown in FIG. 3, the input terminals for setting the block address ADSEL1, ADSEL2, and ADSEL3 as an address setting member set the address by grounding or opening each terminal.

According to the setting of the input terminals for setting the number of the unit cells to be measured SEL1, SEL2, and SEL3, the switching circuit 2 inputs the positive voltage of the top voltage into the regulator 6 as a battery generating member. The regulator 6 generates a specific voltage (for example, five volts) from the top voltage, and supplies the specific voltage as a power supply voltage to the voltage measuring device 1.

Here, a setting and an operation of the voltage measuring device 1 will be explained. Firstly, the input terminals for setting the number of the unit cells to be measured SEL1, SEL2, and SEL3 are set. In FIG. 1, twelve unit cells BT1 to BT12 are connected. Therefore, SEL1, SEL2, and SEL3 are all open for setting the number of unit cells to be measured to twelve. After the number of unit cells to be measured is set, switches SW17, SW19, SW21, SW23, SW25 are changed according to the setting. In FIG. 1, because the anode of the unit cell BT12 connected to the input terminal IN12 outputs the top voltage, the switch SW25 is closed for connecting the IN12 to an input of the regulator 6. Namely, the top voltage is inputted to the battery generating member based on the number of the unit cells set by the setting member. The regulator 6 generates a specific voltage (for example, five voltages) to be supplied to the voltage measuring device 1 from the inputted top voltage (namely, a total voltage by connecting BT1 to BT12 in series). Incidentally, in this embodiment, because the voltage measuring device 1 is made of an IC chip, each switch is made of a transistor (for example, FET). Therefore, closing the switch means that, for example, conducting source and drain electrodes of an FET by applying a voltage to a gate electrode.

Next, the input terminals for setting the block address ADSEL1, ADSEL2, and ADSEL3 are set. In FIG. 1, the input terminals are all open. Therefore, according to a table in FIG. 3, the block address is set to eight. Therefore, only the block address of eight is received form the not-shown CPU or the like, the voltage measuring operation is carried out.

Thus, when the voltage measuring device 1 of witch the input terminals for setting the number of the unit cells to be measured SEL1, SEL2, SEL3, and the input terminals for setting the block address ADSEL1, ADSEL2, ADSEL3 are set receives eight as the block address from the not-shown CPU or the like, the logic circuit 5 turns the switches in the switching circuit 2 so that the input interface 3 measures the voltage across each connected unit cell, and the A/D converter 4 converts the measured voltage to the digital value, then, the logic circuit 5 outputs the digital value to the CPU or the like. For example, when measuring the voltage across the unit cell BT1, the logic circuit 5 controls to close the switches SW0, SW2 of the switching circuit 2, and the A/D converter 4 converts to the digital value, then, the logic circuit 5 outputs the digital value to the CPU or the like.

Here, for another example, a case that the number of the unit cells to be measured is eight, namely, a case that the unit cells BT1 to BT8 are connected to the voltage measuring device 1 will be explained. Firstly, as shown in FIG. 2, all the input terminals for setting the number of the unit cells to be measured SEL1, SEL2, SEL3 are grounded. Then, the switches SW17, SW19, SW21, SW23, SW25 are turned according to the setting. When the number of the unit cells to be measured is eight, the anode of the unit cell BT8 connected to the input terminal IN8 outputs the top voltage. Therefore, for inputting this top voltage to the regulator 6, the switch SW17 is closed. The logic circuit 5 turns on the switches SW0, SW2, SW4, SW6, SW8, SW10, SW12, SW14, SW16 so that the input interface 3 measures the voltage across each connected unit cells. Then, the A/D converter 4 converts to the digital value, then, the logic circuit 5 outputs the digital value to the CPU or the like. Namely, according to the number of the unit cells set by the setting member, the control member connects the connecting member to the voltage measuring member.

According to the voltage measuring device 1 described the above, according to the setting of SEL1, SEL2, SEL3, the logic circuit 5 only turns on the selected switches in the switching circuit 2 connected to the unit sells, and then the unit cells are measured. Therefore, the number of the unit cells to be measured can be varied, and a suitable design corresponding to the suitable number of unit cells of the high voltage battery mounted on a vehicle can be carried out without cost increase.

Further, according to the setting of SEL1, SEL2, SEL3, any one of SW17, SW19, SW21, SW23, SW25 is connected to the regulator 6 so that the top voltage of the unit cells connected in series is inputted to the regulator 6 to generate the voltage supplied to the voltage measuring device 1. Therefore, no external battery is needed, and the power supply voltage is generated from the high voltage battery BT. Further, because the top voltage is changed internally, the power supply voltage is hardly affected by the noise. Further, because the regulator 6 generates the power supply voltage from the top voltage, even when the top voltage is changed owing to a change of the number of the unit cells connected in series, a constant voltage can be supplied to the voltage measuring device 1.

Second Embodiment

Figure 4:
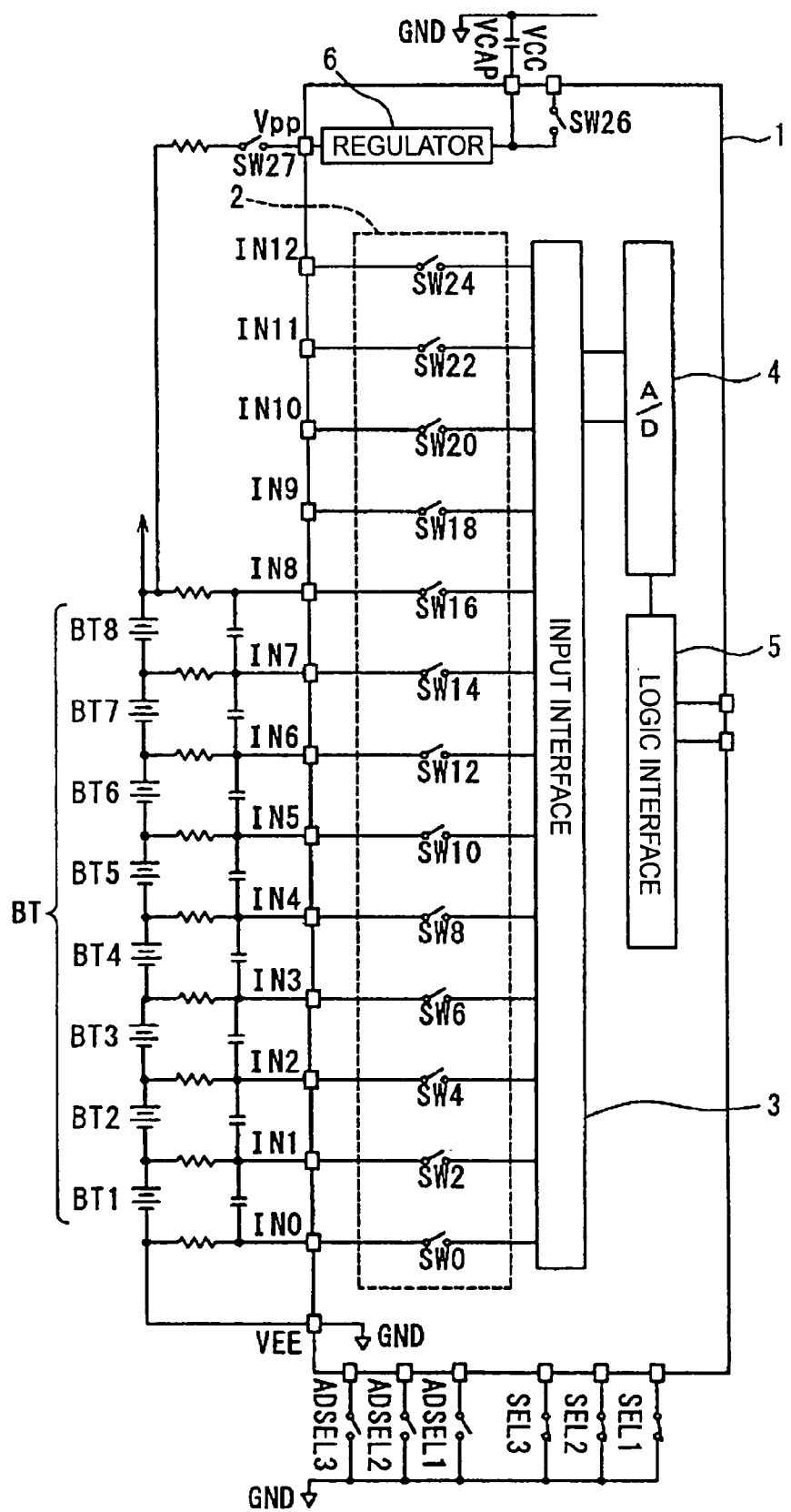
FIG. 4 is a circuit diagram showing the voltage measuring device according to a second embodiment of the present invention.

Next, the voltage measuring device 1 according to a second embodiment of the present invention will be explained with reference to FIG. 4.

In the second embodiment, the switches SW17, SW19, SW21, SW23, SW25 existing in the switching circuit 2 of the first embodiment are canceled. The top voltage is inputted from input terminal Vpp of the voltage measuring device 1 to the regulator 6. FIG. 4 shows an example where the number of unit cells to be measured is eight. In this case, all of SEL1, SEL2, SEL3 are grounded to set the number of unit cells to be measured to eight. Then, the logic circuit 5 only turns on the switches SW0, SW2, SW4, SW6, SW8, SW10, SW12, SW14, SW16 in the switching circuit 2. The A/D converter 4 converts to the digital value, and the logic circuit 5 outputs the digital value to the CPU or the like.

According to the voltage measuring device 1 described the above, according to the setting of SEL1, SEL2, SEL3, the logic circuit 5 turns on the switches in the switching circuit 2 connected to the unit cells, and measures the voltage across the unit cells. Therefore, the number of the unit cells to be measured can be varied, and a suitable design corresponding to the suitable number of unit cells of the high voltage battery mounted on a vehicle can be carried out without cost increase.

Further, the top voltage is inputted from input terminal Vpp of the voltage measuring device 1 to the regulator 6. Therefore, switches for selecting the top voltage are not used, and a scale of the voltage measuring device 1 can be downsized. Therefore, a chip size of the IC can be reduced. Further, even if SEL1, SEL2, SEL3 are wrongly set, the top voltage is surely supplied to the regulator 6.

Here, a block diagram of a voltage measuring system using the voltage measuring device 1 according to the first or second embodiment of the present invention will be explained with reference to FIGS. 5 to 7.

Figure 5:
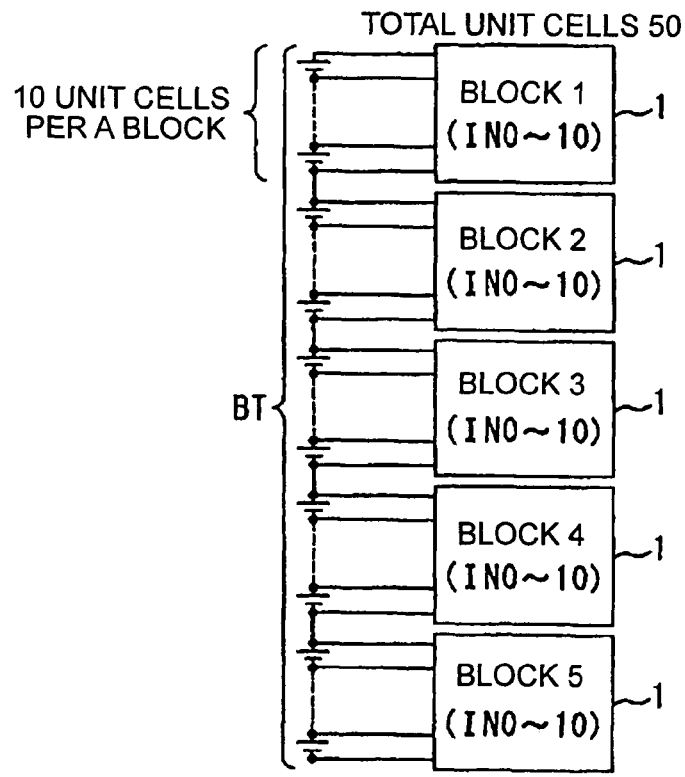
FIG. 5 is a block diagram showing a voltage measuring system according to the first embodiment of the present invention.

As shown in FIG. 5, in the voltage measuring system, fifty unit cells are connected in series to compose the high voltage battery and divided into five blocks, each of which includes the voltage measuring device 1. In a BLOCK1, the unit cells are connected to the input terminals IN0 to IN10 of the voltage measuring device 1. Namely, in BLOCK1, ten unit cells are connected. Accordingly, as shown in FIG. 2, SEL1 and SEL3 are grounded, and SEL2 is open for setting the number of unit cells to ten. As shown in FIG. 3, ADSEL1, ADSEL2, ADSEL3 are all grounded for setting the block address to one. In BLOCK2 to BLOCK5, each number of unit cells to be measured is also ten, and SEL1, SEL2, SEL3 are also grounded. Each block address is set corresponding to each block.

When measuring the voltage, the not-shown CPU or the like inputs the block address to be measured into the voltage measuring device 1 and instructs to measure the voltage. Only the voltage measuring device 1 corresponding to the block address measures the voltage across each unit cell connected to the voltage measuring device 1, and outputs to the CPU or the like.

In such a voltage measuring system, five voltage measuring devices 1 in which the number of the unit cells to be measured is set to ten are provided. Thus, the unit cells to be measured are easily measured by addressing the block address of the voltage measuring device 1. Further, because the same voltage measuring devices 1 are provided, a structure of the voltage measuring system is simple, and the cost of the voltage measuring system can be reduced.

Figure 6:
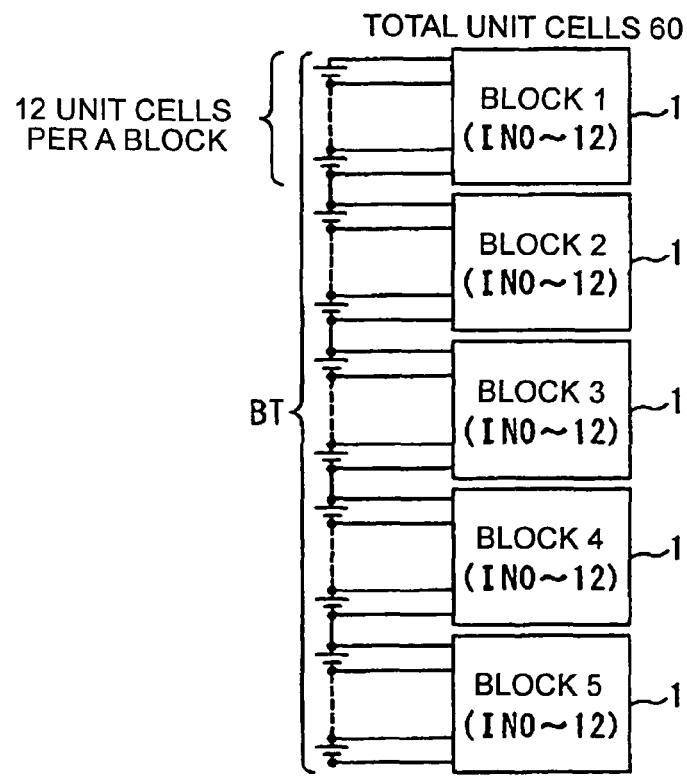
FIG. 6 is a block diagram showing the voltage measuring system according to another embodiment of the present invention.

In FIG. 6, sixty unit cells are connected in series to compose the high voltage battery and divided into five blocks, each of which includes the voltage measuring device 1. Accordingly, the number of the unit cells to be measured is set to twelve. Thus, as shown in FIGS. 5 and 6, when the number of the unit cells is changed, only the setting of the voltage measuring device 1 is changed.

Figure 7:
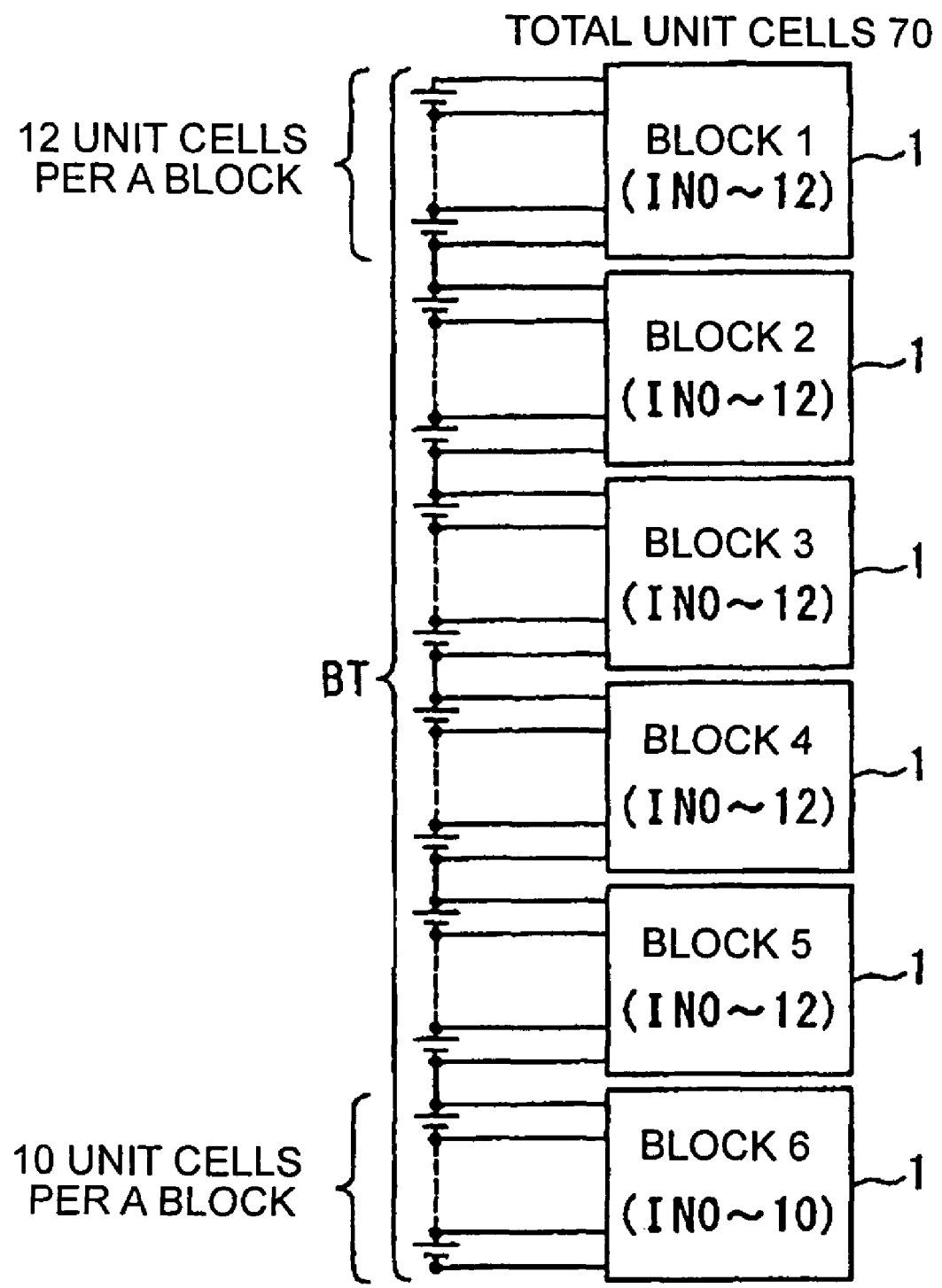
FIG. 7 is a block diagram showing the voltage measuring system according to another embodiment of the present invention.

In FIG. 7, seventy unit cells are connected in series to compose the high voltage battery and divided into six blocks, each of which includes the voltage measuring device 1. In BLOCK1 to BLOCK5, the number of the unit cells to be measured is set to twelve. In only BLOCK6, the number of the unit cells to be measured is set to ten. Thus, even when the number of the unit cells composing the high voltage battery BT is not a multiple of the number of the unit cells of the voltage measuring device 1, another type of an IC or a discrete circuit is not necessary. Even in this case, only the same IC (voltage measuring device 1) can be used.

Incidentally, the setting method of the input terminals for setting the number of the unit cells to be measured or of the input terminals for setting the block address is not limited to grounding or open. For example, Vcc (specific voltage) can be used. For another example, the CPU may input a signal indicating the setting to the logic circuit 5.

Further, the number of the unit cells to be measured and the number of the blocks described above are only examples, and the present invention is not limited to those.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:
1. A voltage measuring device comprising:
a voltage measuring member for measuring a voltage across each unit cell in a block comprising a plurality of unit cells connected to each other in series; and a connecting member connecting each unit cell in the block to the voltage measuring member,
wherein the connecting member includes:

a setting member to set the number of the unit cells in the block to be connected to the voltage measuring member;

an address setting member to set a unique address to the block;

a controlling member to connect the connecting member to the voltage measuring member based on the number of the unit cells in the block set by the setting member;

a battery generating member to generate and supply a specific voltage from an inputted voltage; and a voltage switching member comprising a plurality of first and second switches connected in parallel with one another, the first switches configured for electrical connection with the battery generating member and the second switches configure for electrical connection with the voltage measuring member, when the setting member sets the number of the unit cells in the block to be connected to the voltage measuring member then the top cell voltage of the unit cell in the block input into the battery generating member via the first switch and the second switch connects each unit cell in the block to the voltage measuring member.

2. A voltage measuring device as claimed in claim 1, is mounted on each block of the on vehicle high voltage battery which is divided to at least two blocks each having at least one unit cell.

3. The voltage measuring device of claim 1, wherein the battery generating member comprises a regulator.

4. The voltage measuring device of claim 3, wherein the regulator generates the specific voltage from the top cell voltage of the unit cell in the block and supplies the specific voltage as a power supply voltage to the voltage measuring device.

5. The voltage measuring device of claim 1, wherein the voltage measuring member comprises an input interface.

6. The voltage measuring device of claim 5, wherein the input interface is electrically connected to an A/D converter.

7. The voltage measuring device of claim 6, wherein the A/D converter is electrically connected to a logic circuit and outputs a digital value of the logic circuit.

* * * * *